United States Patent
Kim et al.

(10) Patent No.: US 7,782,165 B2
(45) Date of Patent: Aug. 24, 2010

(54) WIRE-STACKED TRANSFORMER

(75) Inventors: Seung-woo Kim, Yongin-si (KR);
Jae-sup Lee, Yongin-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 951 days.

(21) Appl. No.: 11/407,074

(22) Filed: Apr. 20, 2006

(65) Prior Publication Data

US 2007/0090910 A1    Apr. 26, 2007

(30) Foreign Application Priority Data

Oct. 26, 2005    (KR)    .................... 10-2005-0101179

(51) Int. Cl.
*H01F 5/00*    (2006.01)
(52) U.S. Cl. ..................................................... 336/200
(58) Field of Classification Search ............... 336/65, 336/83, 200, 232, 206–208, 192; 257/531
See application file for complete search history.

(56) References Cited

U.S. PATENT DOCUMENTS

| | | | | |
|---|---|---|---|---|
| 6,566,731 B2* | 5/2003 | Ahn et al. | ............... | 257/531 |
| 6,737,948 B2* | 5/2004 | Aoki et al. | ............... | 336/200 |
| 6,903,644 B2* | 6/2005 | Wang et al. | ............... | 336/200 |
| 7,023,315 B2* | 4/2006 | Yeo et al. | ............... | 336/200 |
| 7,236,081 B2* | 6/2007 | Jeong et al. | ............... | 336/200 |

\* cited by examiner

*Primary Examiner*—Tuyen Nguyen
(74) *Attorney, Agent, or Firm*—Sughrue Mion, PLLC

(57) ABSTRACT

A wire-stacked transformer has a first loop supplied with electric power and built with one or more metal plates forming a magnetic field, a second loop disposed in a concentric circle with the first loop and generating induction current, and loop wires disposed between the respective metal plates of the first loop and supplying electric power to each metal plate. Accordingly, efficiency of a power amplifier can be enhanced by reducing the loss of the DAT.

11 Claims, 4 Drawing Sheets

WIRE-STACKED TRANSFORMER

CROSS-REFERENCE TO RELATED APPLICATIONS

This application claims priority from Korean Patent Application No. 10-2005-0101179, filed Oct. 26, 2005 in the Korean Intellectual Property Office, the entire contents of which are incorporated herein by reference.

BACKGROUND OF THE INVENTION

1. Field of the Invention

The present invention relates to a wire-stacked transformer, and more particularly, to a wire-stacked transformer capable of improving the efficiency of a power amplifier with its loss reduced.

2. Description of the Related Art

In general, wireless communication equipment such as hand-held terminals employs semiconductor chip devices serving as radio-frequency communication circuits. It is very important to build a single chip including a transmitter and a high-frequency power amplifier having a suitable power level with respect to a material cost reduction and efficiency of the transmitter. To build such a single chip, both the power amplifier and transmitter are built as complementary metal-oxide-semiconductor (CMOS) devices. However, CMOS devices have difficulties implementing a power amplifier due to their low breakdown voltage and substrate resistance. As such, technologies for building the power amplifier which overcome such low breakdown voltage and substrate resistance are highly desirable for improvements of output power and efficiency of the integrated-circuit amplifier.

The distributed active transformer (DAT) is used to boost the breakdown voltage of such a power amplifier.

FIG. 1 is a circuit diagram for showing a conventional DAT. As shown in FIG. 1, the DAT has a first loop 10 supplied with electric power, a second loop 20 generating induction current by current flowing in the first loop 10, and plural power supply units 60 for supplying electric power to the first loops 10.

The first loop 10 is formed with four metal plates disposed to form a rectangular shape, and each metal plate serves as a drain tuning inductor resonating with parasitic transistor capacitance and for controlling a harmonic signal. In here, the metal plate inductor has a Quality factor (Q-factor) higher than a spiral inductor.

The power supply units 60 are disposed between neighboring metal plates and thus interconnect cathode terminals of the output ports of the respective metal plates. Each power supply unit 60 is formed with a pair of transistors, the sources of which are interconnected and commonly grounded. The gate of one of the transistors is driven with a positive phase signal, and the gate of the other transistor is driven with a negative phase signal. Such power supply units 60 cause substantial AC ground to be formed at each corner of the first loop 10.

The second loop 20 is formed with a metal plate of a rectangular frame shape forming one loop, and each side of the metal plate serves as one metal coil. That is, the second loop 20 generates induction current caused by the first loop 10 and serves as the second loop of the transformer.

The loss of such a DAT affects the efficiency of the whole power amplifier module, and, in particular, the DAT has a drawback of degrading the efficiency of the whole power amplifier due to its inherent large power loss when it is used as an output matching circuit of the power amplifier.

In general, as the metal plates forming the first loop 10 and the second loop 20 become thicker, the distance between the virtual centers of the first loop 10 and the second loop 20 becomes shorter. It is to be noted that the virtual center refers to a substantial centerline of a magnetic field forming when electric current flows in the first loop 10 and the second loop 20. Since the first loop 10 and the second loop 20 in the conventional DAT form a single loop respectively, the centerlines of the first loop 10 and the second loop 20 become a line connecting the center of the metal plate in the transverse direction of the metal plate forming each loop, respectively.

However, the thickness of the metal plate forming each loop of the DAT is generally determined at the time of the production process, and since the first loop 10 and the second loop 20 are formed in a single loop in the current DAT structure, respectively, the virtual centers of the respective loops are inevitably and considerably spaced apart from each other.

Accordingly, a method which can compensate for the above shortcomings, which do not have the metal plate of the DAT itself become thicker, thereby improving the efficiency of the power amplifier with reduction of DAT loss.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention is to provide a wire-stacked transformer capable of improving the efficiency of a power amplifier with its power loss reduced.

According to an aspect of the present invention, there is provided a wire-stacked transformer, comprising a first loop supplied with electric power and built with one or more metal plates forming a magnetic field, a second loop disposed in a concentric circle with the first loop and generating induction current, loop wires disposed on at least one of the first loop and the second loop, in an elongated arrangement along the lengthwise direction of the first and the second loops, and a power supply disposed between the respective metal plates of the first loop and supplying electric power to each metal plate.

The loop wires can include a first loop wire connected in parallel with the first loop and a second loop wire connected in parallel with the second loop.

Both end portions of the first and second loop wires can be bonded on the first loop and the second loop in a longitudinal direction thereof, respectively.

Preferably, but not necessarily, each metal plate of the first loop has one or more first loop wires mounted thereon in proximity to each other.

Preferably, but not necessarily, the second loop has a plurality of second loop wires mounted in proximity to each other and along a lengthwise direction of the second loop.

Preferably, but not necessarily, the first loop wire and the second loop wire are most closely mounted on the first loop and the second loop, respectively.

Preferably, but not necessarily, the first loop wire and the second loop wire are mounted closely to each other.

The first loop wire and the second loop wire can be formed of bonding wire. According to one aspect of the present invention, a wire-stacked transformer may be provided, comprising a first coil forming an electromagnetic field with a power supply, a second coil arranged concentrically with the first coil and generating an induction current, and one or more loop wires mounted on at least one of the first and the second coils, in an elongated arrangement in a lengthwise direction of the first and the second coils.

According to another aspect of the present invention, a wire-stacked inductor may be provided, comprising a coil inducing a voltage in proportion to an electric current, and one or more loop wires provided in an elongated arrangement in a lengthwise direction of the coil.

According to yet another aspect of the present invention, a wire-stacked transmission line may be provided, comprising one or more loop wires provided in an elongated arrangement in a lengthwise direction.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF THE EXEMPLARY EMBODIMENTS

Hereinafter, description will be made in detail with reference to the accompanying drawings.

Figure 1:
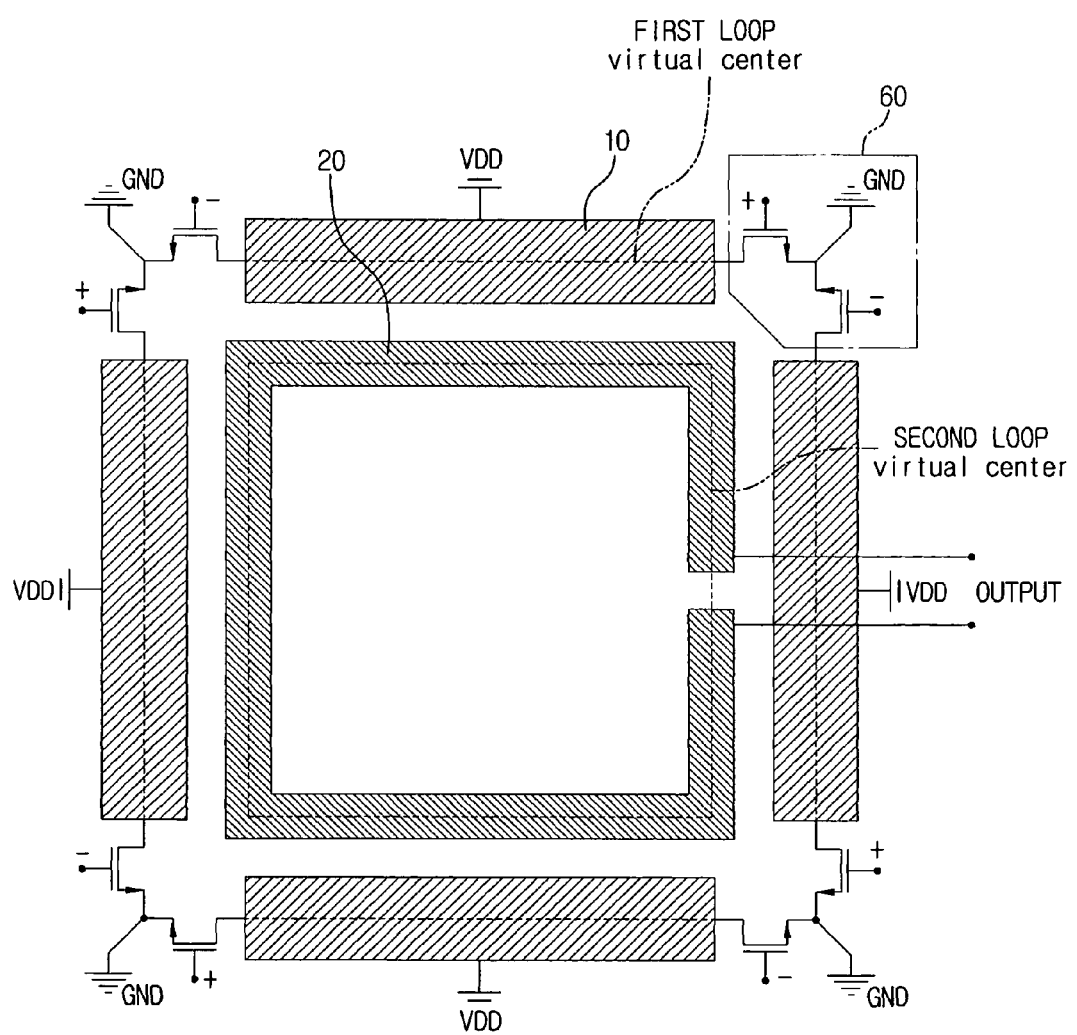
FIG. 1 is a circuit diagram for showing a conventional DAT.
Figure 2:
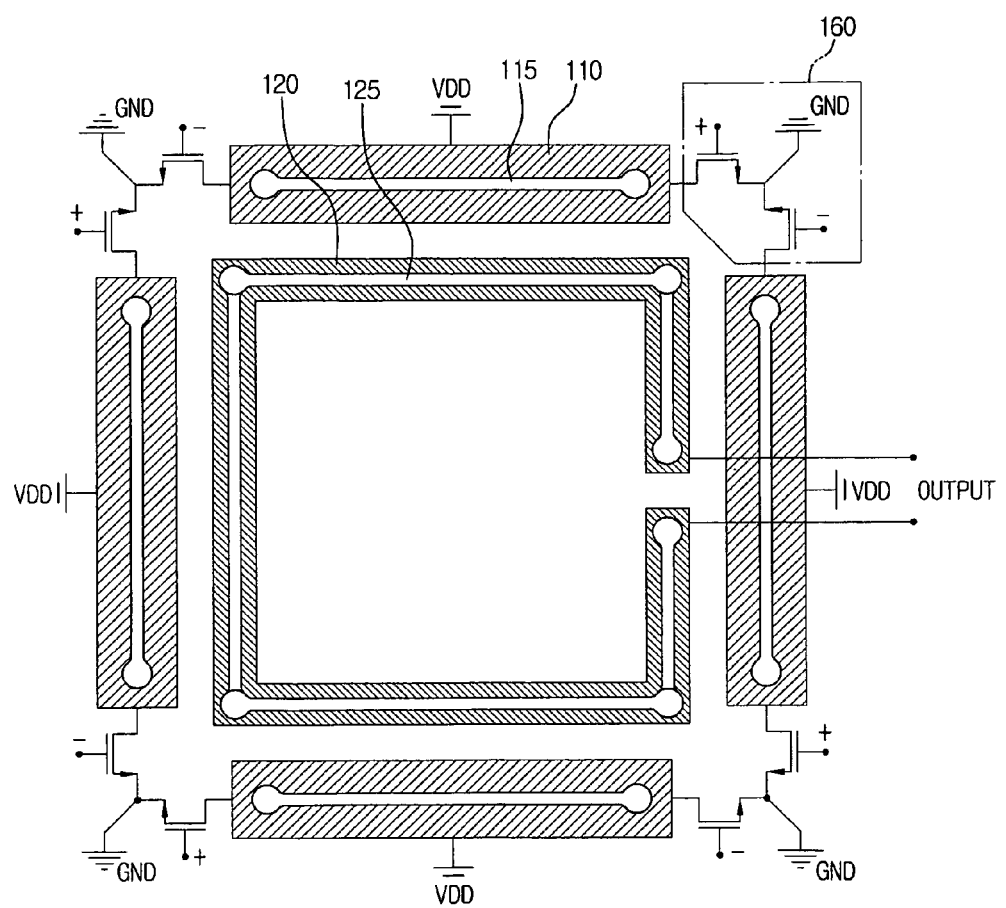
FIG. 2 is a circuit diagram for showing a DAT according to an exemplary embodiment of the present invention.
Figure 3:
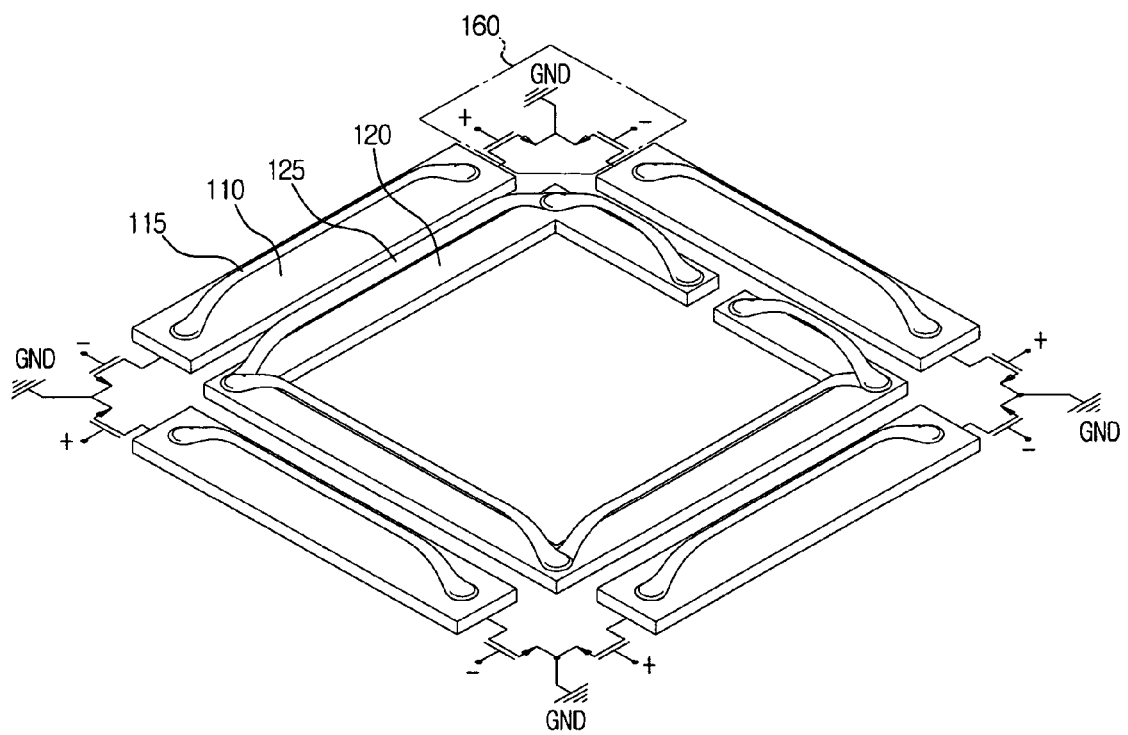
FIG. 3 is a perspective view for showing the DAT of FIG. 2.

FIG. 2 is a circuit diagram for showing a DAT according to an exemplary embodiment of the present invention, and FIG. 3 is a perspective view for showing the DAT of FIG. 2. As shown in FIGS. 2 and 3, the present DAT has a first loop 110, a second loop 120, a first loop wire 115, a second loop wire 125, and power supply units 160.

The first loop 110 is supplied with electric power from the power supply units 160 and generates a magnetic field, and is formed with four metal plates disposed in a rectangular shape. The first loop 110 can be formed with any number of more than one metal plates, and can be formed with more than four metal plates. In the present exemplary embodiment, if more metal plates and power supply units 160 are used, the output power capacity of the whole circuit is increased, and if the shape of the circuit is closer to a circular shape, the efficiency is increased.

The first loop wire 115 is mounted on the upper surface of each metal plate forming the first loop 110, and formed with a bonding wire used for chip bonding. The first loop wire 115 can be formed with a metal wire in addition to the bonding wire, and can be formed with a plate-shaped metal. The first loop wire 115 is welded on the end portions of the first loop 110, and as shown in FIG. 3, the central portion is spaced apart from the first loop 110. In the present exemplary embodiment, the first loop wire 115 can be also welded at a plurality of points of the metal plate in the lengthwise direction.

Such a first loop wire 115 has electric current flowing in the same direction as in the first loop 110, and it brings the same effect as the first loop 110 and the first loop wire 115 being connected in parallel to each other. Accordingly, a value of resistance caused by both the first loop 110 and the first loop wire 115 is smaller than a smaller resistance of either the first loop 110 or the first loop wire 115.

That is, a resistance value of two resistors connected in parallel can be generally expressed in Equation 1.

$$R_{Total} = \frac{R_1 R_2}{R_1 + R_2} \qquad \text{[Equation 1]}$$

For example, if $R_1=5\Omega$ and $R_2=2.5\Omega$, $R_{Total}=2.5\Omega$. Thus, the resistance of the first loop 110 becomes smaller as the first loop 110 and the first loop wire 115 are connected in parallel with each other, which brings the effect of thickening the thickness of the first loop 110. That is, the loss of the DAT can be reduced as the first loop 110 becomes thicker. In the meantime, the loss of the DAT can be further reduced as the first loop wire 115 is bonded to the first loop 110 as closely as possible and multiple wires as thick as possible are used.

The power supply units 160 supply electric power to the first loop 110, and are disposed between the respective metal plates forming the first loop 110 and interconnect the neighboring cathode terminals of the output ports of the respective metal plates. Each power supply unit 160 is formed with a pair of transistors, and can be built with devices such as CMOS, metal oxide semiconductor field-effect transistor (MOSFET), and so on. Description will be made, for example, when the power supply units 160 are built with MOSFETs. The sources of the respective MOSFETs are interconnected and commonly grounded, one of the MOSFETs of the power supply unit 160 is driven when the gate is supplied with a positive phase signal, and the other is driven when the gate is supplied with a negative phase signal. Such a power supply unit 160 causes substantial AC ground to be formed between the respective metal plates of the first loop 110.

The second loop 120 has an opening on its one side, and is disposed inside of the first loop 110 to form a concentric circle with the first loop 110. The second loop 120 has induction current caused by the first loop 110 and the first loop wire 115, but the induction current flows in the opposite direction to the first loop 110 and the first loop wire 115.

The second loop wire 125 is mounted on the upper side of the metal plate forming the second loop 120, and at least one second loop wire 125 is mounted on each side of the rectangular metal plate forming the second loop 120. Both end portions of the second loop wire 125 are welded on the upper side of the second loop 120 in the longitudinal direction thereof, but multiple points of the second loop wire 125 can be welded in predetermined intervals on the second loop 120 in the longitudinal direction or multiple short second loop wires 125 can be fixed on one side of the second loop 120.

The second loop wire 125 has the effect of being connected in parallel with the second loop 120, and has induction current flowing in the same direction as in the second loop 120. Further, as in the first loop 110 and the first loop wire 115, the resistance value of the second loop wire 125 and the second loop 120 becomes smaller than the resistance value of the second loop 120 or the second loop wire 125. Therefore, since the resistance value becomes smaller due to the parallel connection of the second loop 120 and the second loop wire 125 as the substantial thickness of the second loop 120 increases, the loss of the DAT can be reduced. In the meantime, as is the case in the first loop wire 115, the loss of the DAT can be further reduced as the second loop 120 and the second loop wire 125 are bonded as closely as possible and a plurality wires as thick as possible are used. Further, the loss of the DAT can be reduced as the first loop wire 115 and the second loop wire 125 are bonded as close to each other.

Figure 4:
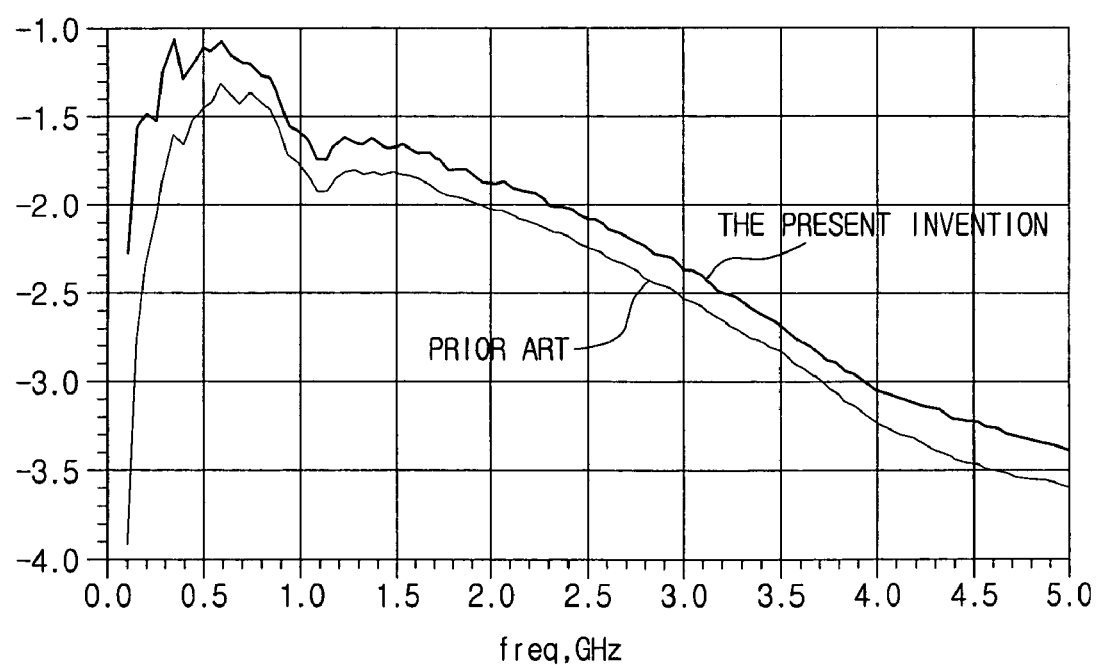
FIG. 4 is a graph for showing comparisons of losses of the DAT of the present invention and the conventional DAT.

FIG. 4 is a graph for showing comparisons of losses of the DAT of the present invention and the conventional DAT. As shown in FIG. 4, the DAT of the present invention has less loss compared to the conventional DAT over whole band frequencies. Further, the DAT of the present invention is 0.4 dB less at maximum compared to the conventional DAT.

Table 1 shows how the loss of such a DAT affects the efficiency of a power amplifier, comparing the DAT of the present invention with the conventional DAT.

TABLE 1

|  | PA performance |  | PAE |  |
|---|---|---|---|---|
|  | PAE | Gain | DAT Loss = 1.45 dB | DAT Loss = 1.1 dB |
| Linear power amplifier | 50% | 25 dB | 35.75% | 38.76% ($\Delta$ = 3%) |
| Switching power amplifier | 75% | 25 dB | 53.63% | 58.15% ($\Delta$ = 4.5%) |

As shown in Table 1, if the loss of the DAT is 1.45 dB in the linear power amplifier, that is, if the conventional DAT is used, the Power Amplifier Efficiency (PAE) is 35.7%, but, if the loss of the DAT is 1.1 dB, that is, if the DAT of the present invention is used, the PAE is increased to 38.76%. In case of the switching power amplifier when the conventional DAT is used, the PAE is 53.63%, but, if the DAT of the present invention is employed, the PAE is increased to 58.15% by 4.5%.

As shown above, the DAT of the present invention has the first loop wire 115 and the second loop wire 125 mounted on the first loop 110 and the second loop 120, respectively, so as to substantially increase the thickness of the first loop 110 and the second loop 120 and thereby reduce the resistance. Therefore, the Q-factor is improved and the loss of the DAT is reduced, so the efficiency of the power amplifier can be improved.

In the meantime, the above exemplary embodiment has the bonding wire mounted on the first loop 110 and the second loop 120 of the DAT, but can have the bonding wire fixed on a typical spiral transformer or an inductor and transmission line, thereby reducing the loss. In case of a transformer, a loop wire may be mounted on one of a first coil forming an electromagnetic field with a supplied power and a second coil arranged concentrically with the first coil and generating inductive current. In the case of an inductor, a loop wire may be mounted in the lengthwise direction of the coil, and in the case of a transmission line such as a microstrip line or a coplanar line, a loop wire may be mounted in a lengthwise direction of the line.

As mentioned above, the present invention can enhance the efficiency of the power amplifier by reducing the loss of the DAT.

Further, the foregoing embodiments are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A wire-stacked transformer, comprising:
   a first loop supplied with electric power and comprising a plurality of metal plates which form a magnetic field;
   a second loop disposed in a concentric form with the first loop and generating an induction current;
   a loop wire which is disposed above at least one of the first loop and the second loop in a longitudinal direction thereof; and
   a power supply disposed between the respective metal plates of the first loop and supplying electric power to each metal plate,
   wherein at least two areas of the loop wire are bonded on the at least one of the first loop and the second loop, and a remaining area of the loop wire is spaced apart from the at least one of the first loop and the second loop, and
   wherein the at least two areas of the loop wire are bonded on a same metal plate.

2. The wire-stacked transformer as claimed in claim 1, wherein the loop wires comprise:
   a first loop wire connected in parallel with the first loop; and
   a second loop wire connected in parallel with the second loop.

3. The wire-stacked transformer as claimed in claim 2, wherein both ends of the first and second loop wires are bonded on the first loop and the second loop in a longitudinal direction thereof, respectively.

4. The wire-stacked transformer as claimed in claim 3, further comprising a plurality of first loop wires, wherein each first loop wire is disposed on a corresponding one of the metal plates of the first loop in proximity to each other.

5. The wire-stacked transformer as claimed in claim 4, further comprising a plurality of second loop wires disposed on the second loop in proximity to each other, along a lengthwise direction of the second loop.

6. The wire-stacked transformer as claimed in claim 5, wherein the first loop wires and the second loop wires are most closely mounted on the first loop and the second loop, respectively.

7. The wire-stacked transformer as claimed in claim 6, wherein the first loop wire and the second loop wire are mounted closely to each other.

8. The wire-stacked transformer as claimed in claim 7, wherein each of the first loop wires and the second loop wires is formed with a bonding wire.

9. A wire-stacked transformer comprising:
   a first coil forming an electromagnetic field with a power supply;
   a second coil arranged concentrically with the first coil and generating an induction current; and
   a loop wire which is disposed above at least one of the first loop and the second loop in a longitudinal direction thereof,
   wherein at least two areas of the loop wire are bonded on the at least one of the first loop and the second loop, and a remaining area of the loop wire is spaced apart from the at least one of the first loop and the second loop, and
   wherein the at least two areas of the loop wire are bonded on a same metal plate of any one of the first loop and the second loop.

10. A wire-stacked inductor comprising:
    a coil inducing a voltage in proportion to an electric current; and
    one or more loop wires which are disposed above the coil in a longitudinal direction thereof,
    wherein at least two areas of each of the loop wires are bonded on the coil, and a remaining area of the each of the loop wires is spaced apart from the coil, and
    wherein the at least two areas of each of the loop wires are bonded on a same metal plate of the coil.

11. A wire-stacked transmission line comprising one or more loop wires which are disposed above the coil in a longitudinal direction thereof,
    wherein at least two areas of each of the loop wires are bonded on the coil, and a remaining area of the each of the loop wires is spaced apart from the coil, and
    wherein the at least two areas of each of the loop wires are bonded on a same metal plate of the coil.

* * * * *